(12) United States Patent
Steeneken et al.

(10) Patent No.: US 7,969,262 B2
(45) Date of Patent: Jun. 28, 2011

(54) REDUCTION OF AIR DAMPING IN MEMS DEVICE

(75) Inventors: Peter G. Steeneken, Valkenswaard (NL); Jozef Thomas Martinus Van Beek, Rosmalen (NL); Theodoor Rijks, Eindhoven (NL)

(73) Assignee: Epcos AG, Munich (DE)

( * ) Notice: Subject to any disclaimer, the term of this patent is extended or adjusted under 35 U.S.C. 154(b) by 427 days.

(21) Appl. No.: 11/718,142

(22) PCT Filed: Oct. 24, 2005

(86) PCT No.: PCT/IB2005/053477
§ 371 (c)(1),
(2), (4) Date: Sep. 16, 2009

(87) PCT Pub. No.: WO2006/046194
PCT Pub. Date: May 4, 2006

(65) Prior Publication Data
US 2010/0001615 A1    Jan. 7, 2010

(30) Foreign Application Priority Data
Oct. 27, 2004    (EP) .................................... 04105342

(51) Int. Cl.
*H01H 51/22*    (2006.01)
(52) U.S. Cl. ......................................... 335/78; 200/181
(58) Field of Classification Search .................. 335/78; 200/181
See application file for complete search history.

(56) References Cited

U.S. PATENT DOCUMENTS

| 5,578,976 | A | * | 11/1996 | Yao ................................. 333/262 |
| 5,880,921 | A | * | 3/1999 | Tham et al. .................... 361/233 |
| 5,955,659 | A | | 9/1999 | Gupta et al. |
| 6,307,452 | B1 | * | 10/2001 | Sun ................................. 333/262 |
| 6,635,506 | B2 | * | 10/2003 | Volant et al. ..................... 438/52 |
| 6,740,946 | B2 | * | 5/2004 | Funaki ........................... 257/415 |
| 6,795,235 | B1 | | 9/2004 | Okuno et al. |
| 7,102,472 | B1 | * | 9/2006 | Nathanson et al. ............. 335/78 |
| 2002/0027064 | A1 | | 3/2002 | York et al. |

(Continued)

FOREIGN PATENT DOCUMENTS
GB    2 353 410 A    2/2001

(Continued)

OTHER PUBLICATIONS
RF-MEMS, ISBN-0-471-20169-3 pp. 62.

*Primary Examiner* — Anh T Mai
*Assistant Examiner* — Bernard Rojas
(74) *Attorney, Agent, or Firm* — Slater & Matsil, L.L.P.

(57) ABSTRACT

A micro-electromechanical device has a substrate (10), a movable element, movable towards the substrate by electrostatic forces on electrodes, facing surfaces of the movable element and the substrate being shaped such that one or more venting channels (VC) are defined by the facing surfaces when they are in a closed position, configured to enable fluid between the facing surfaces to flow across the facing surfaces, to enter or exit the area between the facing surfaces. Such channels can enable fluid damping of the movement of the moveable element to be controlled. Increasing the flow entering or exiting the area between the facing surfaces, can reduce such damping, and hence increase speed of opening and closing of the device. The channels can connect to holes in the electrodes.

19 Claims, 4 Drawing Sheets

U.S. PATENT DOCUMENTS

| | | |
|---|---|---|
| 2002/0190267 A1 | 12/2002 | Robertson |
| 2003/0080839 A1* | 5/2003 | Wong .............................. 335/78 |
| 2003/0098618 A1 | 5/2003 | Greenberg et al. |
| 2003/0148550 A1 | 8/2003 | Volant et al. |
| 2004/0126921 A1 | 7/2004 | Volant et al. |
| 2004/0202437 A1 | 10/2004 | Okuno et al. |
| 2005/0190023 A1* | 9/2005 | Nakatani et al. ................. 335/78 |

FOREIGN PATENT DOCUMENTS

| | | |
|---|---|---|
| WO | WO 01/48550 A1 | 7/2001 |
| WO | 01/59504 A2 | 8/2001 |
| WO | 01/59504 A3 | 8/2001 |
| WO | WO 03/015128 A2 | 2/2003 |

* cited by examiner

REDUCTION OF AIR DAMPING IN MEMS DEVICE

TECHNICAL FIELD

This invention relates to MEMS devices, to semiconductor devices such as integrated circuits and to apparatus incorporating such MEMS devices, and to methods of offering communication services over such devices.

BACKGROUND

The term 'MEMS' (Micro-electromechanical system or structure or switch) can encompass various devices. A common arrangement of a MEM device comprises a freestanding beam with a first electrode located opposite a second electrode. The first and the second electrode are mutually separated by an air gap. The first electrode can be moved towards or away from the second electrode by application of an actuation voltage to provide an electrostatic force (in principle other forces could be used such as an inductive force).

Some common applications are:

use as a microphone or a loudspeaker; (using a specific type of membrane)

use as a sensor, particularly an air pressure sensor use as a resonator use as pixel switches in a display, or driving a mirror for an optical switch, use in RF applications, particularly as a switch or as a variable capacitance.

One of the commercially important applications is the use for variable impedance matching with integrated band switching in the front end of a mobile wireless device such as a phone or computer.

Two common constructions are as follows:

1. A MEMS structure in a substrate of silicon. In this case the electrodes are oriented perpendicular to the substrate surface. This construction is used for the sensor application and for the resonator application (other applications are not excluded).

2. A MEMS structure as a thin-film element. The beam is here oriented substantially parallel to the substrate. This type of MEMS structure is used for RF MEMS. There are at least two constructions for the beam:

a double clamped beam (a beam that is connected to the substrate surface at two or more sides, so the deflection to the substrate occurs in the centre of the beam). This type of beam is known as a beam with both ends built in and is statically indeterminate.

a single clamped beam (in which case the deflection to the substrate occurs at the end of the beam). This type of beam is called a cantilever beam and is statically determinate.

The beam is generally provided with holes, provided for the etching of the sacrificial layer between the beam and the substrate to create the air gap. These holes also help to reduce air damping by allowing air to flow in and out of the cavity between beam and substrate, while opening or closing the beam. However there are manufacturing techniques in which the beam is assembled to the substrate, so no holes are needed for the etching as described in GB-A-2,353,410. It is also possible to use a beam that is an intermediate layer between a top electrode and a bottom electrode.

It is known from U.S. Pat. No. 5,955,659 to provide holes in a movable diaphragm element of a MEM pressure sensor device, to vent fluid from a cavity. It is known from US patent application 2003/0148550 to provide a MEM device with holes in the movable element and having a copper electrode recessed into the substrate to reduce stiction. Another method of addressing stiction is shown in WO 01/59504, using a flap valve to force fluid such as a gas through holes in the substrate, into the contact area. It is also known to provide roughness or dimples on the contact surfaces to reduce stiction.

SUMMARY OF THE INVENTION

An object of the invention is to provide improved devices. According to a first aspect, the invention provides a microelectromechanical device having a substrate, a movable element, movable with respect to, e.g. towards the substrate, facing surfaces of the movable element and the substrate being shaped such that one or more venting channels are defined by the facing surfaces when they are in a closed position, configured to enable fluid between the facing surfaces to flow across the facing surfaces, to enter or exit the area between the facing surfaces. The fluid may be a gas, e.g. air or nitrogen. The venting channels run mainly parallel to the facing surfaces. The channels preferably end up in a vertical venting hole or at the side of the surface. The venting channels may extend into and along the substrate e.g. by partial removal of the substrate with a substrate transfer technique.

Venting holes do not allow fluid/gas to enter the area between the facing surfaces because the surfaces are not facing each other at the position of the venting hole. The venting channels can be part of the design of the bottom electrode. The term 'channel' includes any two-dimensional extension in lateral direction (e.g. parallel to the substrate).

The fact that the channels allow fluid to enter the area between the facing surfaces is an important advantage of the present invention.

Such channels can enable fluid, e.g. gas, damping of the movement of the moveable element to be controlled. Usually it is desired to increase the flow entering or exiting the area between the facing surfaces, to reduce such damping, and hence increase speed of opening and closing of the device. Much of the opening delay is concerned with the initial stage of opening, since the electrostatic attraction is greatest when the electrodes are closest. Usually the electrostatic force during opening is close to 0 because the actuation voltage is turned off. This is also where air damping is high because the air has least space to move. Similarly for device closing, the reduction in damping will be most pronounced at the final stage of closing for the same reasons. As this is where most of the closing delay occurs, the channels can enable a notable increase in closing speed. The benefits in terms of speed can be traded for other advantages such as reducing drive voltage or spring rate for a given speed, or using a higher operating pressure or higher viscosity fluid for a given speed for example. Another use for the channels could be to allow fluid to be forced in between the facing surfaces when closed, to help force them apart, to increase opening speed or overcome stiction.

As an additional feature, the device has electrodes for driving the movable element, and one or more of the channels are located on a surface of the electrodes. The electrodes are often the largest part of the facing surfaces, and so damping reduction can be more effective if the channels can be located on the electrodes.

Particularly, the MEMS device with the venting channels may be implemented with a process in which the movable element comprises a mechanical layer and an intermediate layer. The mechanical layer provides the required mechanical stability. In the intermediate layer the electrode is defined that is to be moved towards and from the substrate to set the capacity or to open or close a switch. This electrode in the intermediate layer is connected to the mechanical layer with vertical interconnects. The vertical interconnects may be manufactured as an integral portion of the mechanical layer. If now this electrode is segmented, the spaces between the individual segments can be used effectively as a portion of the venting channels.

An additional feature is the movable element or the substrate having holes to vent fluid from the contact surfaces. This can also contribute to a reduction in damping.

Another additional feature is the channels being arranged to extend from the holes to areas with no holes. This can enable the combination of channels and holes to work more effectively. The channels can be arranged in a star pattern around each hole.

Another additional feature is the channels having a cross section area between 1 $\mu m^2$ and 500 $\mu m^2$. An optimal cross section of the channels can be similar to the gap size, e.g. from 25 $\mu m^2$-50 $\mu m^2$. This can enable a useful flow rate without too great an impact on other aspects of the design.

Another additional feature is the channels being defined by grooves in the substrate. This can be easier to manufacture than grooves on the movable element, and can avoid weakening the structure of the movable element, or making the movable structure heavier. Non-piercing grooves in the movable element are advantageous.

Another additional feature is the device being contained in a sealed enclosure at a pressure below ambient air pressure. This also contributes to reducing damping.

Another additional feature is a flexible support arranged to provide a return force to separate the facing surfaces, the return force being non linear to provide a greater force near the closed position. This is another way of enabling an increase in switching speed.

Other aspects of the invention include semiconductor devices such as integrated circuits having such devices, mobile handsets having such devices and methods of offering a communications service over such handsets. This is a recognition that an ultimate purpose of the improved device can be to enable improved communication services which can be charged for. The value of the services can be much greater than the sales value of the devices, which in some cases can be provided free of charge, so all the value comes from the services.

Any of the additional features can be combined with each other and with any aspect of the invention. Other advantages will be apparent to those skilled in the art, especially compared to other prior art. Numerous variations and modifications can be made without departing from the scope of the claims of the present invention. Therefore, it should be clearly understood that the form of the present invention is illustrative only and is not intended to limit the scope of the present invention. How the present invention may be put into effect will now be described by way of example with reference to the appended schematic drawings.

BRIEF DESCRIPTION OF THE DRAWINGS

The features of the invention will be better understood by reference to the accompanying drawings, which illustrate preferred embodiments of the invention. In the drawings.

DETAILED DESCRIPTION OF ILLUSTRATIVE EMBODIMENTS

Figure 1:
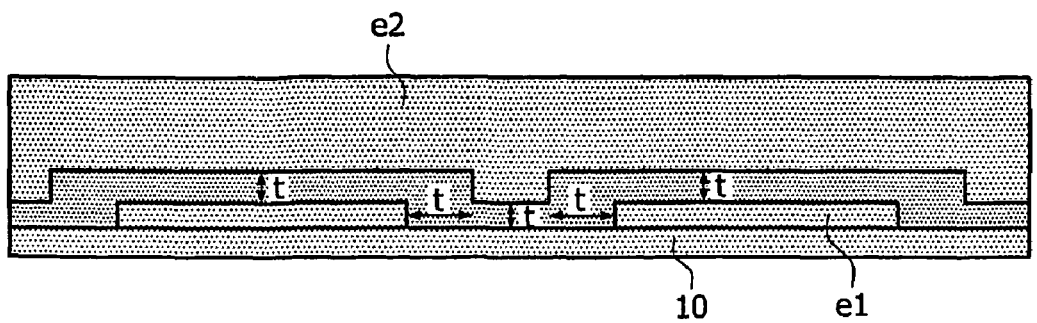
FIGS. 1 to 3 show a cross section of an embodiment of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

The term "fluid" includes both gases and liquids.

The closing speed of an electrostatic switch can be increased by applying a higher actuation voltage. However as the electrostatic force is always attractive, the opening speed is purely determined by the spring constant of the structure and the air damping. Air damping is the dominating factor limiting the open and close time of RF-MEMS switches. For a given switch voltage and beam stiffness a reduction of ambient air pressure can result in a dramatic reduction of open and close times of RF-MEMS switches. E.g. a pressure reduction from 1 bar to 1 mbar can reduce the switch time by more than a factor 50.

For a MEMS switch (where the dimensions of the membrane area are usually much larger than the gap distance) the dominant air damping force is the squeeze film damping force which is given by:

$$F_{sfd} = \frac{bv}{z^3} \tag{1}$$

Where v is the speed and z is the distance between the electrodes. One way to reduce the effect of air damping is to provide holes in the membranes to reduce the constant b. As is explained in G. Rebeiz, "RF-MEMS", ISBN-0-471-20169-3. pp. 62, the air damping coefficient b is derived from Reynolds gas-film equation, and is given by, $$b = 3 \cdot \mu A^2 / (\pi \cdot g^3) \quad (2)$$

Where μ is the viscosity of the gas (which is dependent on gas pressure), A the area of the moving electrode, and g the gap between the moving and the fixed electrode. A known method for reducing b is the perforation of the moving electrode by an array of holes. In this way, the distance travelled by the air to escape the gap between the moving and fixed electrode is reduced. In formula (2) this is equivalent to the reduction of the effective area A.

Figure 2:
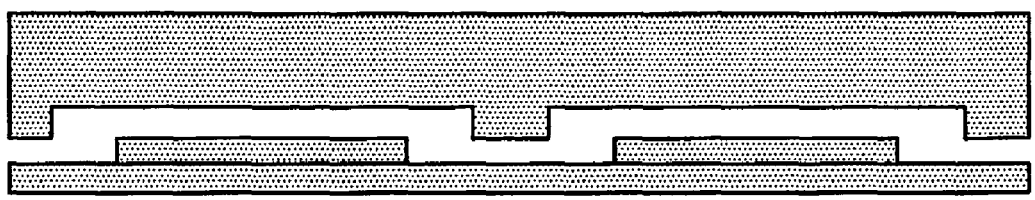
Figure 3:
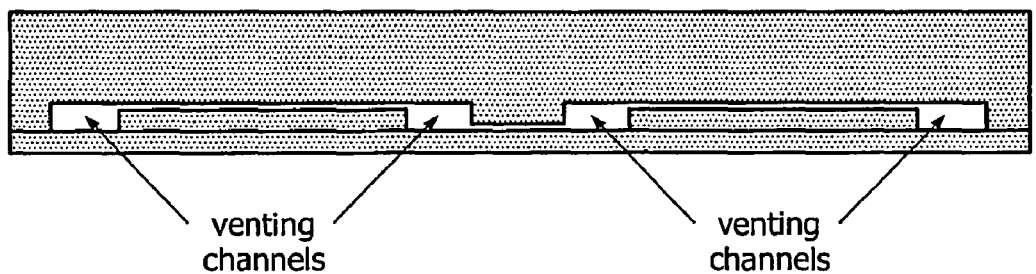

Embodiments described below can achieve a further reduction of the effective area A. The air damping is reduced through the creation of coplanar venting channels between the moving and fixed electrodes. The channels can be defined by the etching of grooves in the bottom electrode and conformal coating of the sacrificial layer during MEMS manufacturing, as is depicted in FIG. 1. This shows a substrate 10, and electrodes e1 formed on the substrate. These can encompass the driving electrodes or the contact electrodes for a switch, or the capacitor electrodes for a tunable capacitor for example. A gap of width t is created by forming a sacrificial layer above the electrodes, between the facing surfaces of the parts, following established practice. Above the gap is the movable electrode e2. FIG. 2 shows the device after the sacrificial material is removed. The venting channels are created when the moving electrode is pulled down in use, as shown in FIG. 3. In a typical example, the channels have a width of 20 μm and a depth of 5 μm but smaller dimensions can still be useful. The dimensions can be arranged according to the viscosity of the fluid, the length of the channels, (depending on spacings between the holes) and other factors. In FIG. 3 the distance t is typically 3 μm the venting channels are typically 3×1 μm².

Figure 4:
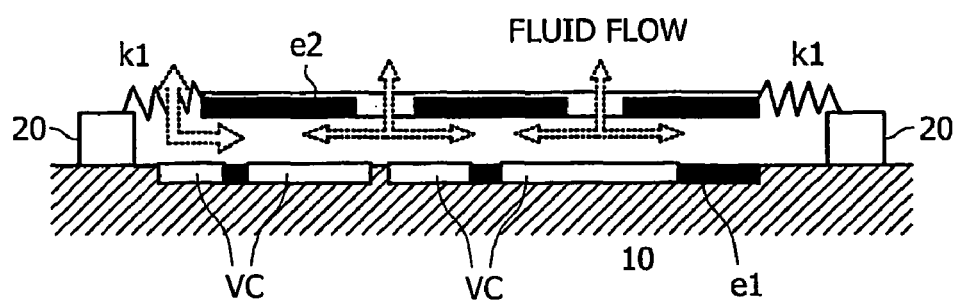
FIG. 4 shows a schematic view of an arrangement having holes according to another embodiment of the present invention.

In FIG. 4 a side view of another embodiment is shown. In this case, it shows a MEMS switch, comprising 2 electrodes $e_1$ and $e_2$, separated by a gap and suspended by a flexible support in the form of a spring k1 at each side. These can bring structural benefits. They provide a return force against the electrostatic force forcing the electrodes closer together when a higher voltage is applied to them (for applications to switches, this corresponds to a closed state of the switch). The springs are attached to anchors 20. Depending on the application for the device, the movable element can be attached for example to a mirror, to electrical switch contacts, or to capacitor plates, and so on. The electrode e2 on the movable element has a number of holes to allow for etching of the gap during manufacture and to allow air flow to reduce air damping. A venting groove pattern VC is defined in the bottom electrode e1. The effect of the venting channels is complementary to the existing method of perforating the moving electrode with an array of venting holes. The channels can assist fluid to enter or exit from the sides of the electrodes or through the holes in the electrode. There can be holes in the substrate also.

Figure 5:
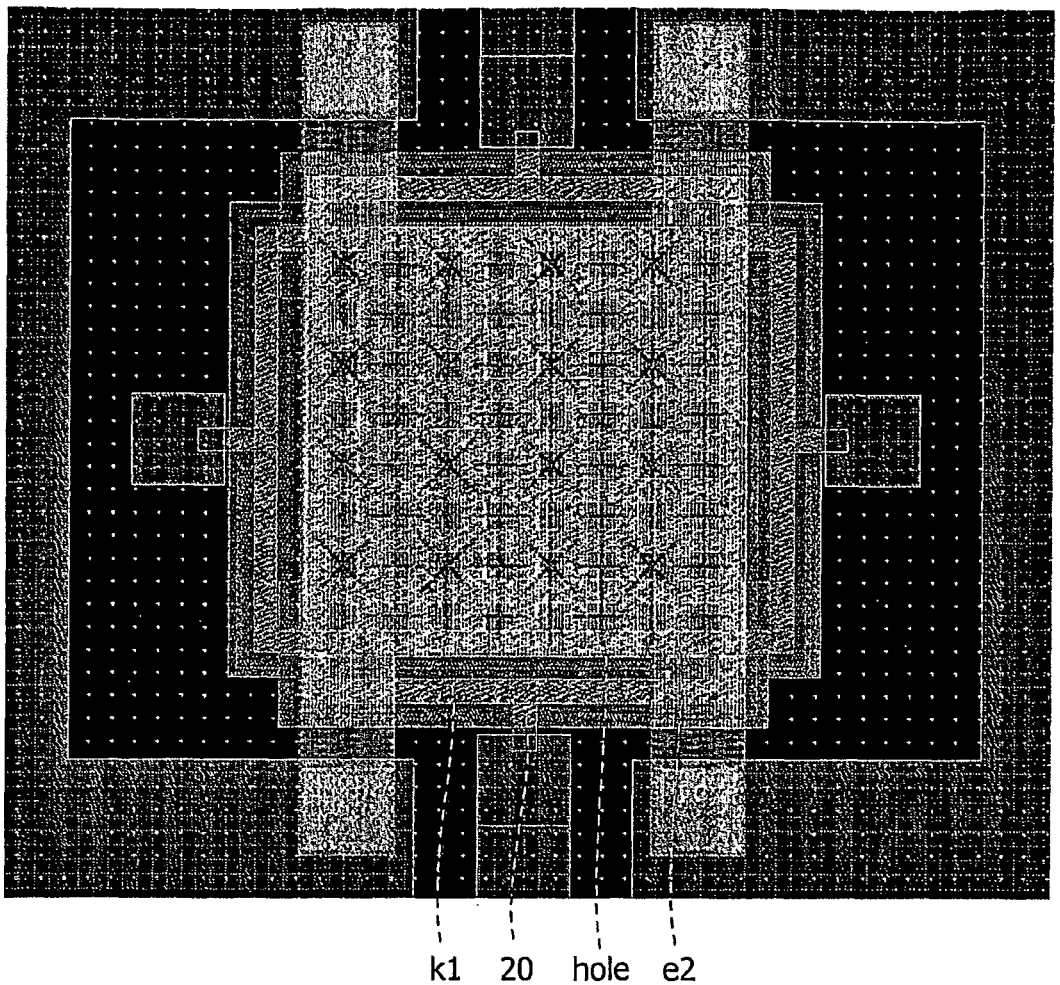
FIGS. 5 and 6 show a plan view of an integrated circuit having holes and a star pattern of channels according to another embodiment of the present invention.

A plan view of a design of a device similar to the arrangement of FIG. 4 is shown in FIG. 5. This shows an electrode e2 with a number of holes to allow for etching of the gap during manufacture and to allow air flow to reduce air damping. Four anchors 20 are shown, at each side of the square. Flexible supporting members k1 stretch from each of the anchors to each corner of the square movable element e2. The spring constant of each of these can be set by the length, thickness and material type for example. The bottom electrode e1 is largely obscured below the other electrodes, and should be largely the same shape as the top electrode. It has contact areas at top and bottom of the diagram.

Figure 6:
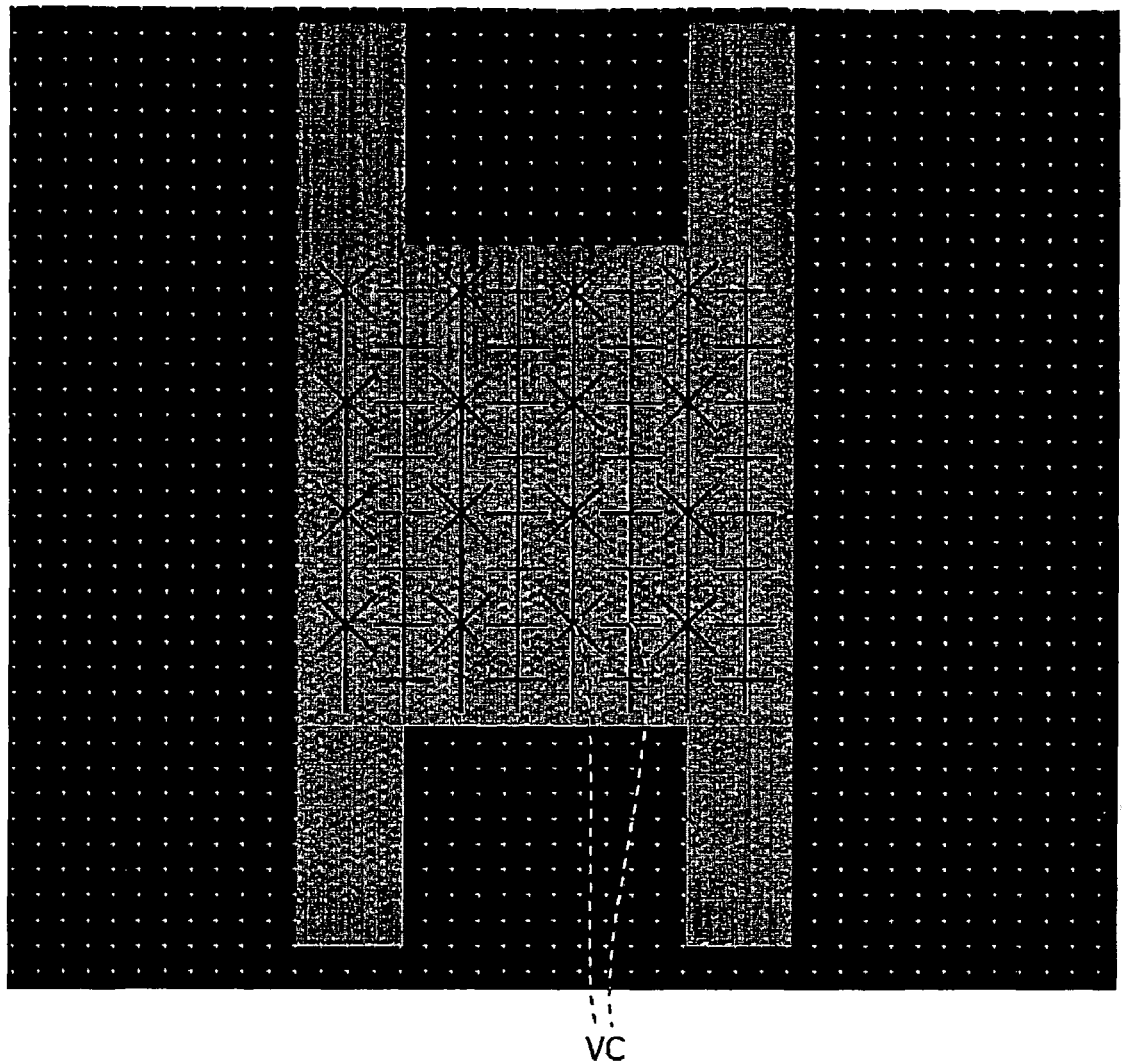

FIG. 6 shows a plan view of the substrate and bottom electrode e1 for the device of FIG. 5. A regular array of star patterns of venting channels can be seen, alternate ones shown as "X" shapes, and as "+" shapes, to enable good coverage of the areas between the holes.

Figure 7:
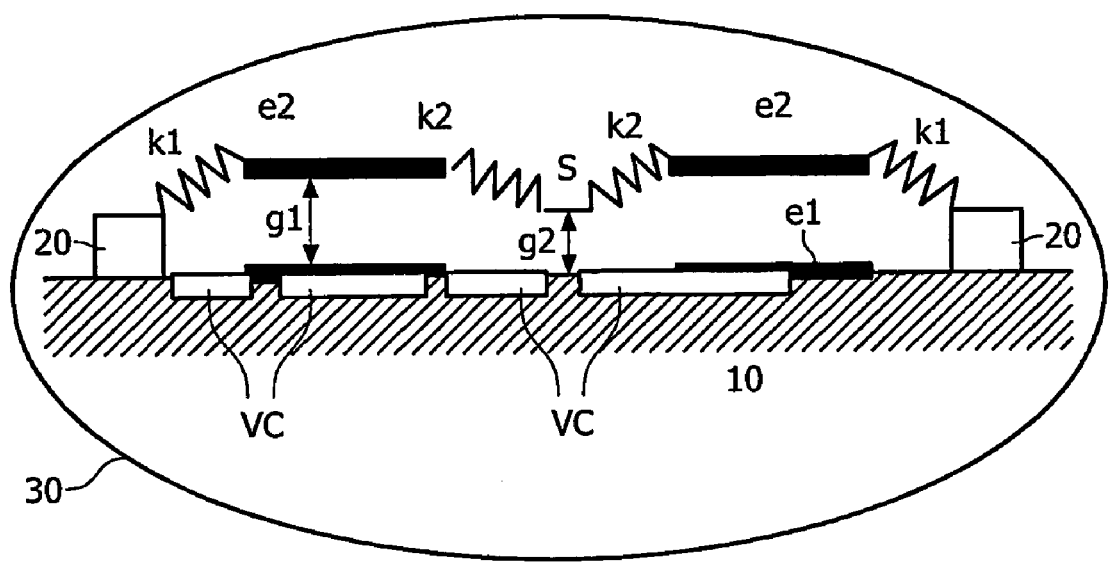
FIG. 7 shows a schematic view of another embodiment of the present invention having a stamp to give a non-linear spring force, and a low pressure enclosure.

FIG. 7 shows another embodiment which can produce a further increase in the speed of switching, by using an additional spring in the form of a stamp structure. The opening speed is purely determined by the spring constant of the structure and the air damping. Such a stamp structure can improve on the conventional design as follows: it can increase the opening speed and can increase reliability by increasing the spring force separating the facing surfaces and thus helping avoid stiction.

Compared to a conventional MEMS switch, which comprises 2 electrodes $e_1$ and $e_2$, separated by a gap $g_1$ and suspended by a spring $k_1$, the switch of FIG. 7 comprises a movable element which has an electrode e2 and an independently movable section termed a 'stamp'. This stamp is connected to the top (or bottom) electrode by a resilient coupling in the form of a spring $k_2$ and is separated from the substrate by a gap $g_2$. The stamp protrudes into the gap so that the gap g2 is smaller than the gap between the electrodes. The contact area A beneath the stamp is not used as an electrode, so the device area may be increased slightly. Effect on $V_{PI}$:

The equations that conventionally govern the voltage levels on the electrodes at which pull-in and release of the facing surfaces occur are:

$$V_{PI}^2 = 8k_1 g_1^3/(27A\epsilon_0) \text{ and } V_{rel}^2 = 2g_1 k_1 A\epsilon_0/C_{down}.$$

First the difference between the pull-in and release voltage of the proposed switch and that of a conventional switch will be discussed. If $g_2$ is larger than $g_1/3$, the pull-in voltage $V_{PI}$ of the top membrane will not be affected, so at $V_{PI}$ the switch will close until the stamp touches the substrate. At that point the gap between the electrodes is $g_1 - g_2$ and the effective spring constant of the switch will be $k_1 + k_2$. From the pull-in equation it can be seen that the pull-in voltage of a structure with stamp will be the same as that without stamp as long as:

$$k_1 g_1^3 > (k_1 + k_2(g_1 - g_2 k_2/(k_1 + k_2)))^3.$$

If for example $g_2 = g_1/2$ and $k_2 = k_1$, the pull-in voltage is not increased. Note that even if $V_{PI}$ is increased, the ratio of $V_{PI}/V_{rel}$ is still beneficially influenced by the stamp. Effect on $V_{rel}$:

The stamp increases $V_{rel}^2$ by a factor:

$$\frac{V_{rel,stamp}^2}{V_{rel,conventional}^2} = 1 + \frac{k_2}{k_1}\left(1 - \frac{g_2}{g_1}\right) \quad (3)$$

Thus it is seen that the stamp structure can increase the reliability of the MEMS structure. If for example, $g_2 = 0.6\, g_1$ and $k_2 = 9\, k_1$, the release voltage would increase by 90% as a result of the stamp, while leaving the pull-in voltage unaffected. Effect on speed:

Although the stamp will slow the switch a bit down during its closing motion, this effect will not be very large, as the force of the stamp is only significant when the switch is almost closed whereas the electrostatic force is very large in this region and can easily compensate the spring force. It can be shown that the speed of the switch during closing is largest when the electrodes are close together.

When opening, the opening force of the stamp will be very helpful in the first stages of the switch motion, as the air damping force is largest in this region (see equation (1)). That some extra force in the initial opening stages of the switch motion could reduce the switching time a lot, is confirmed by showing that a typical switch spends about 80% of the opening time to travel only the first 20% of the gap. If again $g_2 = 0.6\, g_1$ and $k_2 = 9k_1$ it is seen that the spring force in the closed state is increased by a factor of 4.6, which will surely increase the speed of the switch considerably, the switching time might be reduced by a factor of 2-3.

The stamp S is supported on both sides by resilient couplings k2 as shown in FIG. 7. This movable element has an electrode e2 with an aperture in the middle to locate the stamp S. The electrode e1 on the substrate also has a gap in the middle for the contact area of the stamp. Other configurations are conceivable. The device can optionally be enclosed in an enclosure 30 to enable the pressure of the surrounding fluid to be lowered, or to enable the device to be surrounded by a liquid or a gas other than air for example. There can be holes in the electrodes. The various measures for reducing damping complement each other. The channels can be used in reverse for enabling fluid to be pumped to the contact areas to help separate the surfaces if desired.

The MEM devices in accordance with the present invention and described above can be incorporated into semiconductor devices e.g. those including passive components (e.g. passive chip), with L, C, R and/or diodes and the like as well as integrated circuits with active elements.

The MEM devices in accordance with the present invention and described above can be incorporated into mobile devices such as wireless phone handsets, or wireless mobile computing devices for example. Although described with regard to elements movable perpendicular to a substrate, in principle the movement can be parallel or have a component parallel. As described above, a micro-electromechanical MEM device has a substrate (10), a movable element, movable towards the substrate, facing surfaces of the movable element and the substrate being shaped such that one or more venting channels (VC) are defined by the facing surfaces when they are in a closed position, configured to enable fluid between the facing surfaces to flow across the facing surfaces, to enter or exit the area between the facing surfaces. Such channels can enable fluid damping of the movement of the moveable element to be controlled. Increasing the flow entering or exiting the area between the facing surfaces, can reduce such damping, and hence increase speed of opening and closing of the device. The channels can connect to holes in the electrode.

It is to be understood that although preferred embodiments, specific constructions and configurations, as well as materials, have been discussed herein for devices according to the present invention, various changes or modifications in form and detail may be made without departing from the scope and spirit of this invention.

Thus in summary, the invention provides a micro-electromechanical device has a substrate 10, a movable element, movable towards the substrate by electrostatic forces on electrodes, facing surfaces of the movable element and the substrate being shaped such that one or more venting channels VC are defined by the facing surfaces when they are in a closed position, configured to enable fluid between the facing surfaces to flow across the facing surfaces, to enter or exit the area between the facing surfaces. Such channels can enable fluid damping of the movement of the moveable element to be controlled. Increasing the flow entering or exiting the area between the facing surfaces, can reduce such damping, and hence increase speed of opening and closing of the device. The channels can connect to holes in the electrodes.

The invention claimed is:

1. A micro-electromechanical device comprising:
a substrate; and
a movable element, the movable element or the substrate having one or more holes to vent fluid from the contact surfaces,
wherein the movable element is movable with respect to the substrate,
wherein facing surfaces of the movable element and the substrate are shaped such that one or more venting channels are defined by the facing surfaces when they are in a closed position, configured to enable fluid between the facing surfaces to flow across the facing surfaces, to enter or exit the area between the facing surfaces,
wherein the venting channels are arranged to extend from the holes to areas with no holes, and
wherein three or more of the venting channels are arranged to radiate out in a star pattern from each of the holes.

2. The device of claim 1, further comprising electrodes for driving the movable element, wherein one or more of the venting channels are located on a surface of the electrodes.

3. The device of claim 1, wherein the venting channels have a cross section area between 25 $\mu m^2$ and to 50 $\mu m^2$.

4. The device of claim 1, wherein the venting channels are formed by grooves in the substrate.

5. The device of claim 1, wherein the device is contained in a sealed enclosure at a pressure below ambient air pressure.

6. The device of claim 1, further comprising a flexible support arranged to provide a return force to separate the facing surfaces, the return force being non linear to provide a greater force near the closed position.

7. A semiconductor device having the device of claim 1.

8. A wireless communications device having a semiconductor as set out in claim 7.

9. A method of offering a communications service over the communications device of claim 8.

10. A micro-electromechanical device comprising:
a substrate; and
a movable element, the movable element or the substrate having one or more holes to vent fluid from the contact surfaces,
wherein the movable element is movable with respect to the substrate,
wherein facing surfaces of the movable element and the substrate are shaped such that one or more venting channels are defined by the facing surfaces when they are in a closed position, configured to enable fluid between the facing surfaces to flow across the facing surfaces, to enter or exit the area between the facing surfaces, and
wherein the venting channels are formed by grooves in the substrate.

11. The device of claim 10, further comprising electrodes for driving the movable element, wherein one or more of the venting channels are located on a surface of the electrodes.

12. The device of claim 10, wherein the movable element or the substrate has one or more holes to vent fluid from the contact surfaces.

13. The device of claim 12, wherein the venting channels are arranged to extend from the holes to areas with no holes.

14. The device of claim 10, wherein the venting channels have a cross section area between 25 $\mu m^2$ and 50 $\mu m^2$.

15. The device of claim 10, wherein the device is contained in a sealed enclosure at a pressure below ambient air pressure.

16. The device of claim 10, further comprising a flexible support arranged to provide a return force to separate the facing surfaces, the return force being non linear to provide a greater force near the closed position.

17. A semiconductor device having the device of claim 10.

18. A wireless communications device having a semiconductor as set out in claim 17.

19. A method of offering a communications service over the communications device of claim 18.

* * * * *